United States Patent
An et al.

(10) Patent No.: US 11,626,061 B2
(45) Date of Patent: Apr. 11, 2023

(54) DISPLAY DEVICE

(71) Applicant: SAMSUNG DISPLAY CO., LTD., Yongin-si (KR)

(72) Inventors: Hyung Jun An, Yongin-si (KR); Jeong Oh Jin, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 394 days.

(21) Appl. No.: 16/826,704

(22) Filed: Mar. 23, 2020

(65) Prior Publication Data
US 2020/0402447 A1 Dec. 24, 2020

(30) Foreign Application Priority Data
Jun. 20, 2019 (KR) .................. 10-2019-0073652

(51) Int. Cl.
| | |
|---|---|
| H05K 1/02 | (2006.01) |
| G09G 3/22 | (2006.01) |
| H05K 9/00 | (2006.01) |
| H01L 27/02 | (2006.01) |

(52) U.S. Cl.
CPC ........... G09G 3/22 (2013.01); H01L 27/0248 (2013.01); H05K 1/0215 (2013.01); H05K 9/0007 (2013.01)

(58) Field of Classification Search
CPC ... G09G 3/22; H01L 27/0248; H01L 27/0288; H01L 27/0296
See application file for complete search history.

(56) References Cited

U.S. PATENT DOCUMENTS

| | | | |
|---|---|---|---|
| 9,735,143 B2 | 8/2017 | Kim et al. | |
| 2007/0103827 A1* | 5/2007 | Chang | G09G 3/3611 361/56 |
| 2014/0247570 A1* | 9/2014 | Wang | H05K 1/186 29/837 |
| 2015/0062466 A1 | 3/2015 | Yun | |
| 2017/0090650 A1* | 3/2017 | Jin | G06F 3/0446 |
| 2019/0102022 A1* | 4/2019 | Jang | G06F 3/0412 |
| 2019/0163003 A1* | 5/2019 | Kim | G02F 1/133308 |
| 2020/0103992 A1* | 4/2020 | Sauer | G06F 3/04184 |
| 2020/0137890 A1* | 4/2020 | Lee | H05K 3/46 |

FOREIGN PATENT DOCUMENTS

| | | |
|---|---|---|
| KR | 1020060023623 A | 3/2006 |
| KR | 101140166 B1 | 4/2012 |
| KR | 1020150025356 A | 3/2015 |
| KR | 1020160092592 A | 8/2016 |
| WO | WO-2018021694 A1 * | 2/2018 ........... G02F 1/1333 |

* cited by examiner

*Primary Examiner* — Yuzhen Shen
(74) *Attorney, Agent, or Firm* — Cantor Colburn LLP

(57) ABSTRACT

A display device includes: a display panel including a display area including pixels and a non-display area adjacent to the display area; a first driving integrated circuit including a first ground terminal, where the first driving integrated circuit is electrically connected to the display panel; a first printed circuit board electrically connected to the first driving integrated circuit; a first plate disposed on a bottom surface of the display panel and overlapping with the first driving integrated circuit; and a second plate disposed on the bottom surface of the display panel and spaced apart from the first plate, where the second plate is electrically connected to a system ground.

18 Claims, 7 Drawing Sheets

DISPLAY DEVICE

This application claims to Korean patent application No. 10-2019-0073652, filed on Jun. 20, 2019, and all the benefits accruing therefrom under 35 U.S.C. § 119, the content of which in its entirety is herein incorporated by reference.

BACKGROUND

1. Field

The disclosure generally relates to a display device, and more particularly, to a display device including a driving integrated circuit.

2. Related Art

A display device typically includes a display panel configured to display an image and an input sensor configured to sense an external input. Such a display device may further include driving integrated circuits configured to drive the display panel and the input sensor and at least one printed circuit boards connected to the driving integrated circuits.

SUMMARY

In a display device, when a surge voltage such as static electricity is introduced at from the outside or inside of the display device, the surge voltage may be transferred to driving integrated circuits through printed circuit boards. Accordingly, the driving integrated circuits may be damaged or malfunctioned. Thus, a technique for preventing a surge voltage such as static electricity from being introduced to the driving integrated circuit may be desired.

Embodiments provide a display device including a ground connection component for protecting driving integrated circuits from static electricity.

In accordance with an embodiment of the disclosure, a display device includes: a display panel including a display area including pixels and a non-display area adjacent to the display area; a first driving integrated circuit including a first ground terminal, where the first driving integrated circuit is electrically connected to the display panel; a first printed circuit board electrically connected to the first driving integrated circuit; a first plate disposed on a bottom surface of the display panel and overlapping with the first driving integrated circuit; and a second plate disposed on the bottom surface of the display panel and spaced apart from the first plate, where the second plate is electrically connected to a system ground.

In an embodiment, the display device may further include a conductive film on which the first driving integrated circuit is mounted, where the conductive film may be electrically connected between the display panel and the first printed circuit board.

In an embodiment, the first printed circuit board may include a first ground portion electrically connected to the system ground. In such an embodiment, a first conductive material may be disposed between the second plate and the first ground portion to electrically connect the second plate and the first ground portion to each other.

In an embodiment, the first conductive material may be a conductive tape or a conductive pressure sensitive adhesive ("PSA").

In an embodiment, the display device may further include a first electrostatic discharge protection circuit electrically connected between the first plate and the first ground terminal, where the first electrostatic discharge protection circuit may form an electrostatic discharge path. In such an embodiment, the first plate may be electrically connected to the system ground through the first electrostatic discharge protection circuit.

In an embodiment, the first electrostatic discharge protection circuit may be disposed on the first printed circuit board.

In an embodiment, the first electrostatic discharge protection circuit may be disposed to be spaced apart from the first ground portion of the first printed circuit board.

In an embodiment, the first electrostatic discharge protection circuit may include: a first diode including a first terminal electrically connected to the first ground terminal and a second terminal electrically connected to the first plate; and a second diode including a first terminal electrically connected to the first plate and a second terminal electrically connected to the first ground terminal.

In an embodiment, the display device may further include: a first ground line which connects the first plate and the first electrostatic discharge protection circuit to each other; and a second ground line which connects the first ground terminal and the first electrostatic discharge protection circuit to each other.

In an embodiment, the display device may further include: an input sensor disposed on a top surface of the display panel while overlapping with the display area; a second driving integrated circuit electrically connected to the input sensor, where the second driving integrated circuit may include a second ground terminal; and a second printed circuit board electrically connected to the second driving integrated circuit.

In an embodiment, the second printed circuit board may include a second ground portion electrically connected to the system ground. In such an embodiment, a second conductive material may be disposed between the first printed circuit board and the second ground portion to electrically connect the first ground portion and the second ground portion to each other.

In an embodiment, the display device may further include a second electrostatic discharge protection circuit electrically connected between the first ground terminal and the second ground terminal.

In an embodiment, the second electrostatic discharge protection circuit may be disposed on the first printed circuit board or the second printed circuit board.

In an embodiment, the display device may further include a third electrostatic discharge protection circuit electrically connected between the second ground terminal and the system ground.

In an embodiment, the third electrostatic discharge protection circuit may be disposed on the first printed circuit board or the second printed circuit board.

In an embodiment, each of the first plate and the second plate may be a metal plate.

In an embodiment, the non-display area of the display panel may include a first peripheral area adjacent to the display area, a second peripheral area spaced apart from the first peripheral area, and a bent area between the first peripheral area and the second peripheral area. In such an embodiment, at least a portion of the first plate may overlap with the first driving integrated circuit and the second peripheral area.

In accordance with another embodiment of the disclosure, a display device includes: a display panel including a display area including pixels and a non-display area adjacent to the display area; a first driving integrated circuit including a first ground terminal, where the first driving integrated circuit is electrically connected to the display panel; a first printed circuit board including a first ground portion spaced apart from the first ground terminal, where the first printed circuit board is electrically connected to the first driving integrated circuit; an input sensor disposed on a top surface of the display panel while overlapping with the display area; a second driving integrated circuit electrically connected to the input sensor, where the second driving integrated circuit includes a second ground terminal; a second printed circuit board including a second ground portion spaced apart from the second ground terminal, where the second printed circuit board is electrically connected to the first driving integrated circuit; a first plate disposed on a bottom surface of the display panel and overlapping with the first driving integrated circuit and the second driving integrated circuit; and a second plate disposed on the bottom surface of the display panel and spaced apart from the first plate, where the second plate, the first ground portion and the second ground portion are electrically connected to a system ground.

In an embodiment, the display device may further include: a first electrostatic discharge protection circuit electrically connected between the first plate and the first ground terminal; a second electrostatic discharge protection circuit electrically connected between the first ground terminal and the second ground terminal; and a third electrostatic discharge protection circuit electrically connected between the second ground terminal and the system ground.

In accordance with embodiments of the disclosure, the display device includes the first plate and the second plate that are separated from each other. In such embodiments, the first ground path, along which the second plate, the ground of the first printed circuit board, and the ground of the second printed circuit board are commonly connected to the system ground, is formed, and the ground of the first driving integrated circuit and the ground of the second driving integrated circuit may be separated from the first ground path. In such embodiments, the grounds of the first and second driving integrated circuits may be connected to each other by the back-to-back diodes, so that a surge voltage such as static electricity may be dispersed and/or reduced. Thus, the inflow of a surge voltage into the first and second driving integrated circuits may be minimized or prevented, and the display device may be stably driven.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. It is also noted that herein, "connected/coupled" refers to one component not only directly coupling another component but also indirectly coupling another component through an intermediate component. On the other hand, "directly connected/directly coupled" refers to one component directly coupling another component without an intervening component therebetween.

It will be understood that, although the terms "first", "second", etc. may be used herein to describe various elements, components, regions, layers and/or sections, these elements should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. The phrase "at least one of" modifying listed elements means any and all combinations of one or more of the listed elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 1:
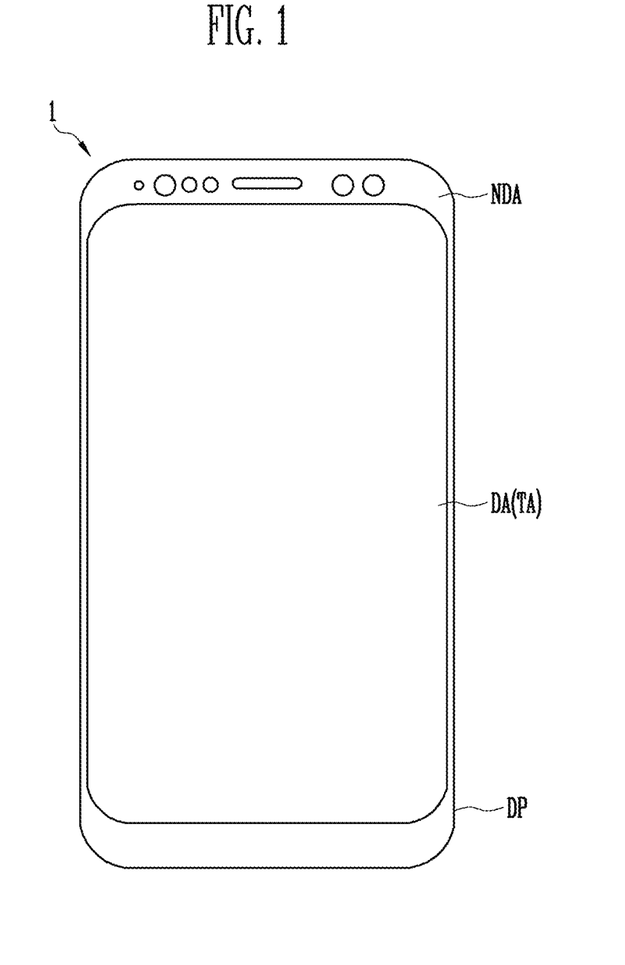
FIG. 1 is a view illustrating a display device in accordance with an embodiment of the disclosure.

FIG. 1 is a view illustrating a display device in accordance with an embodiment of the disclosure.

Figure 2A:
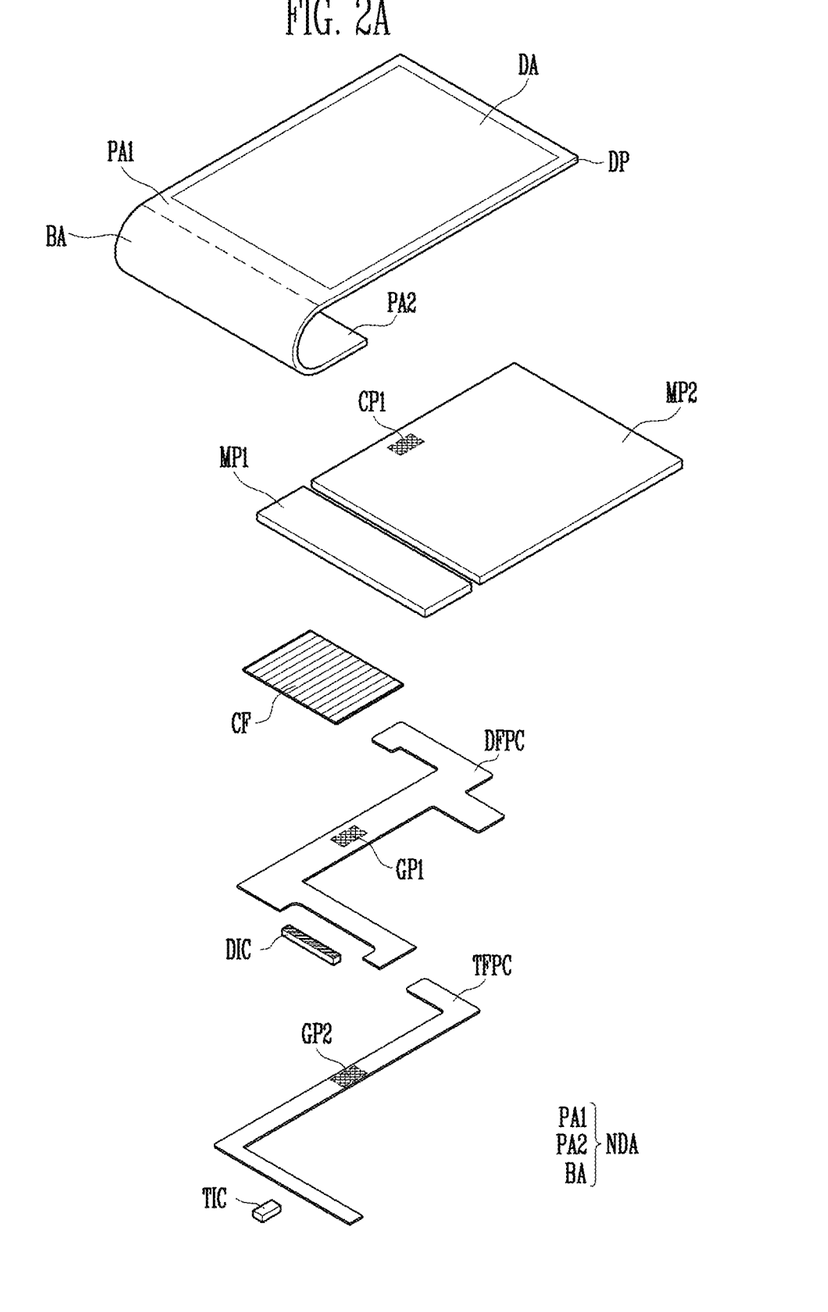
FIG. 2A is an exploded perspective view schematically illustrating an embodiment of the display device shown in FIG. 1.
Figure 2B:
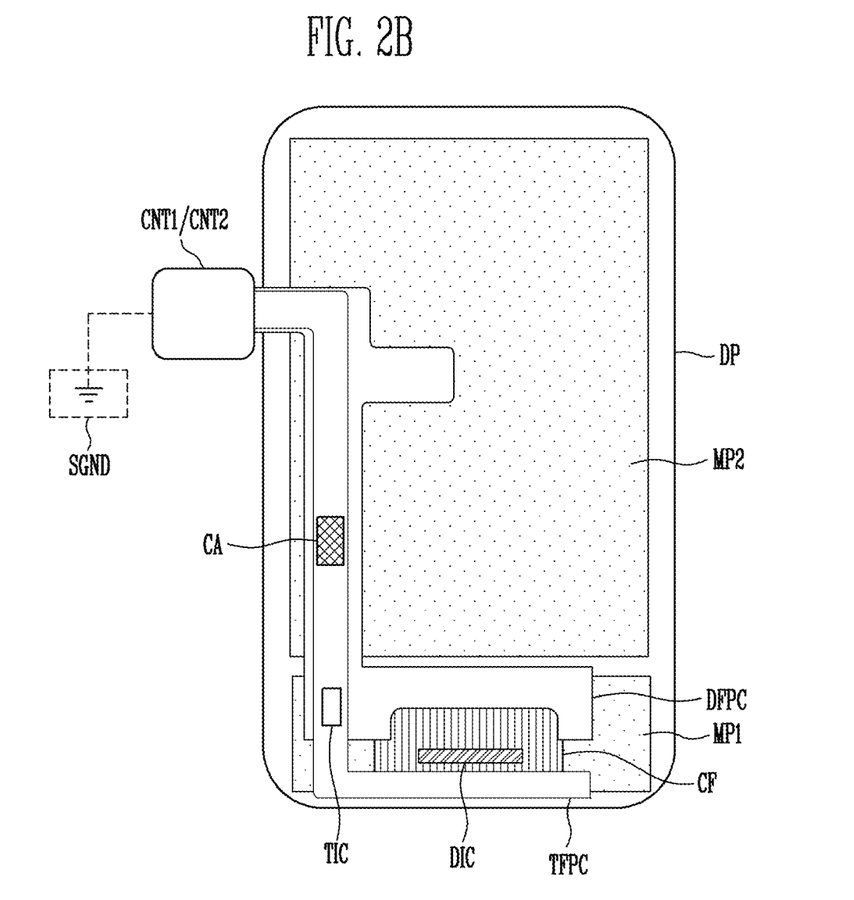
FIG. 2B is a rear view illustrating an embodiment of the display device shown in FIG. 1.
Figure 2C:
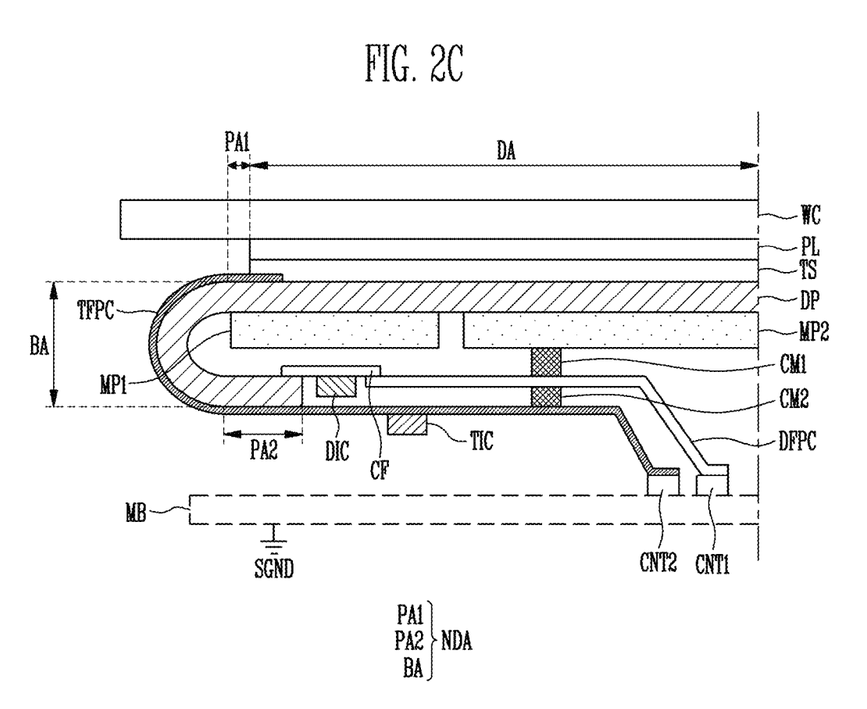
FIG. 2C is a sectional view schematically illustrating a portion of the display device shown in FIG. 1.

FIG. 2A is an exploded perspective view schematically illustrating an embodiment of the display device shown in FIG. 1. FIG. 2B is a rear view illustrating an embodiment of the display device shown in FIG. 1. FIG. 2C is a sectional view schematically illustrating a portion of the display device shown in FIG. 1.

Referring to FIGS. 1 to 2C, an embodiment of the display device 1 may include a display panel DP, a first plate MP1, a second plate MP2, a first driving integrated circuit DIC, and a first printed circuit board DFPC.

In an embodiment, the display device 1 may further include an input sensor TS. In such an embodiment, the display device 1 may further include a second driving integrated circuit TIC for driving the input sensor TS and a second printed circuit board TFPC. The input sensor TS may define an input active area TA. In one embodiment, for example, the input active area TA and a display area DA may substantially correspond to each other.

The display panel DP may include the display area DA including a plurality of pixels and a non-display area NDA adjacent to the display area DA.

The display area DA may display an image corresponding to image data. Each of the pixels included in the display area DA may be an organic light emitting device including an organic layer. However, the pixels are not limited thereto, and alternatively, each of the pixels may be modified in various forms such as an inorganic light emitting device, a liquid crystal device, an electrophoretic device, and an electro-wetting device.

In an embodiment, the display panel DP may be a rigid display panel or flexible display panel. However, in the disclosure, the kind and/or shape of the display panel DP is not particularly limited.

The display panel DP may have an approximately rectangular shape. However, the shape of the display panel DP is not limited thereto, and the display panel DP may have one of various shapes. In one embodiment, for example, the display panel DP may be modified in various shapes such as a closed polygon including linear sides, a circle, an ellipse, etc., including curved sides, and a semicircle, a semi-ellipse, etc., including linear and curved sides. In an embodiment, where the display panel DP has linear sides, at least some of corners of each of the shapes may be formed in a curve.

In an embodiment, at least a portion of the display panel DP may be folded or bent. In one embodiment, for example, the non-display area NDA of the display panel DP may include a first peripheral area PA1 adjacent to the display area DA, a second peripheral area PA2 spaced apart from the first peripheral area PA1, and a bent area BA located between the first peripheral area PA1 and the second peripheral area PA2.

The input sensor TS may be disposed on a top surface of the display panel DP. In an embodiment, the input sensor TS may be disposed directly on an encapsulation layer of the display panel DP. In one embodiment, for example, the input sensor TS may include conductive layers and insulating layers, which are patterned on the encapsulation layer.

Alternatively, the input sensor TS may be implemented with an input sensing panel, and be attached onto the display panel DP by a transparent adhesive material.

The input sensor TS may be a touch sensor, for example. However, the input sensor TS is not limited thereto. The input sensor TS may be a sensor for sensing inputs caused by various input means. In one embodiment, for example, the input sensor TS may include a pressure sensor, a biometric sensor, and the like.

A protective layer PL may be disposed on the input sensor TS, and a window cover WC may be disposed on the protective layer PL. The protective layer PL may effectively prevent moisture, pollutant, etc. from penetrating into the input sensor TS and the display panel DP. The window cover WC may protect internal components of the display device 1 from external impact, scratch, etc.

In an embodiment, at least one functional layer including a polarizing layer, an anti-fingerprint layer, etc. may be further disposed between the display panel DP and the input sensor TS or on the top of the input sensor TS.

The first plate MP1 may be disposed on a bottom surface of the display panel DP. In an embodiment, the first plate MP1 may be disposed on a bottom surface of the display panel DP, which corresponds to a portion of the first peripheral area PA1 and a portion of the display area DA. The first plate MP1 may be attached to the bottom surface of the display panel DP by an adhesive material. The first plate MP1 may overlap with the second peripheral area PA2, the first driving integrated circuit DIC, and the second driving integrated circuit TIC.

In such an embodiment, as shown in FIG. 2C, the first plate MP1 may be disposed between a portion of the display area DA and the second peripheral area PA2, which are disposed opposite to each other.

The second plate MP2 may be disposed on the bottom surface of the display panel DP while being spaced apart from the first plate MP1. The second plate MP2 may overlap with another portion of the display area DA and another portion of the first peripheral area PA1.

The first and second plates MP1 and MP2 may be separate metal plates, and be used as ground electrodes and/or shielding electrodes for discharging static electricity generated from the display panel DP, etc. Accordingly, the first and second plates MP1 and MP2 may minimize or effectively prevent static electricity, electro-magnetic interference (EMI) or the like in the display panel DP from being transferred to the first and second driving integrated circuits DIC and TIC. In one embodiment, for example, the first and second plates MP1 and MP2 may include copper, aluminum, etc.

In such an embodiment, since the first plate MP1 at the portion, at which the first plate MP1 overlaps with the first and second driving integrated circuits DIC and TIC, is separated from the second plate MP2, the influence of a surge voltage such as static electricity, which may be transferred through the second plate MP2, on the first and second driving integrated circuits DIC and TIC may be substantially or effectively reduced.

In an embodiment, an area of the first plate MP1 may be smaller than that of the second plate MP2.

In an embodiment, as shown in FIG. 2A, the second plate MP2 may include a contact portion CP1 in contact with a first ground portion GP1 of the first printed circuit board DFPC. In an embodiment, the contact portion CP1 and the first ground portion GP1 of the first printed circuit board DFPC may be electrically connected to each other by a first conductive material CM1 (shown in FIG. 2C) disposed between the contact portion CP1 and the first ground portion GP1. In one embodiment, for example, the first conductive material CM1 may be a conductive tape or conductive pressure sensitive adhesive ("PSA"). However, this is merely exemplary, and the conductive material is not limited thereto.

The second plate MP2 may be electrically connected to a system ground SGND. In one embodiment, for example, the second plate MP2 may be electrically connected to the system ground SGND through a ground portion (i.e., the first ground portion GP1) of the first printed circuit board DFPC and a ground portion (i.e., a second ground portion GP2) of the second printed circuit board TFPC. Accordingly, a surge voltage such as static electricity, which may be introduced into the second plate MP2, the first printed circuit board DFPC and the second printed circuit board TFPC, maybe be commonly discharged through a path formed up to the system ground SGND. The system ground SGND may be an analog ground for grounding an electronic appliance including the display device 1. In one embodiment, for example, the system ground SGND may be a ground connected to a main circuit board.

The first driving integrated circuit DIC is a driving circuit for displaying an image of the display panel DP, and may include functions of at least one of a data driver and a timing controller.

In an embodiment, a conductive film CF is disposed in the second peripheral area PA2, and the first driving integrated circuit DIC may be mounted on a surface of the conductive film CF in the form of a chip on film ("COF"). In one embodiment, for example, the conductive film CF may be disposed at one end of a bottom surface of the second peripheral area PA2. In such an embodiment, the surface of the conductive film CF, on which the first driving integrated circuit DIC may be mounted, may be in contact with the bottom surface of the display panel DP.

Accordingly, the display panel DP and the first driving integrated circuit DIC may be electrically connected to each other. However, this is merely exemplary, and alternatively, the first driving integrated circuit DIC may be connected to the display panel DP in the form of a chip on panel ("COP") or chip on glass ("COG") in which the first driving integrated circuit DIC is mounted directly on the display panel DP.

The first driving integrated circuit DIC is a driving circuit for displaying an image of the display panel DP, and may include (or have functions of) at least one of the data driver and the timing controller.

In an embodiment, as shown in FIG. 2, the conductive film CF, the second peripheral area PA2, and the first printed circuit board DFPC are spaced apart from the first plate MP1 and the second plate MP2 is, but not being limited thereto. Alternatively, at least a portion of each of the conductive film CF, the second peripheral area PA2, and the first printed circuit board DFPC may be in contact with the first plate MP1 and/or the second plate MP2.

The first printed circuit board DFPC may be disposed (or attached) at one side of the conductive film CF. Therefore, the first printed circuit board DFPC and the first driving integrated circuit DIC may be electrically connected to each other. The first printed circuit board DFPC and the first driving integrated circuit DIC may be disposed to be physically spaced apart from each other.

The first printed circuit board DFPC may be implemented with a rigid printed circuit board (rigid "PCB") or flexible PCB. The first printed circuit board DFPC may include various types of conductive patterns (lines), circuit elements, or the like.

The lines included in the first printed circuit board DFPC may extend along a portion of the back of the display panel DP, and may be electrically connected to a main circuit board MB (or system board) including an application processor ("AP"), etc. through a designated connector (e.g., a first connector CNT1). The planar shape of the first printed circuit board DFPC, which are shown in FIGS. 2A and 2B, is merely exemplary, and the planar shape of the first printed circuit board DFPC is not limited thereto.

In an embodiment, the first printed circuit board DFPC may have a multi-layered structure including at least one conductive layer and at least one insulating layer. In an embodiment, the first printed circuit board DFPC may include a ground layer (or ground pattern) having the first ground portion GP1. The ground layer may be connected as a ground to a line and a circuit, which are included in the first printed circuit board DFPC. In such an embodiment, the ground pattern may be located in a plurality layers in the first printed circuit board DFPC through a contact hole, etc.

The first ground portion GP1 may be exposed to an outside of the first printed circuit board DFPC, and be connected to the second plate MP2 (e.g., the contact portion CP1) by a conductive material.

In an embodiment, the first ground portion GP1 of the first printed circuit board DFPC may be electrically connected to the system ground SGND through a predetermined conductive pattern and the first connector CNT1.

The second printed circuit board TFPC may be disposed on one surface of the first printed circuit board DFPC. In an embodiment, the second printed circuit board TFPC may be connected directly to the input active area TA to have a shape bent along the bent area BA. In one embodiment, for example, one surface of the second printed circuit board TFPC may be in physical contact with one surface of the input sensor TS.

However, this is merely illustrative, and the second printed circuit board TFPC may have a shape connected to one end of the second peripheral area PA2 of the display panel DP. In one embodiment, for example, lines extending from the input sensor TS may extend along the first peripheral area PA1, the bent area BA, and the second peripheral area PA2 of the display panel DP. The extending lines may be connected to the second printed circuit board TFPC disposed at the one end of the second peripheral area PA2.

The second printed circuit board TFPC along with the second driving integrated circuit TIC may control input driving of the input sensor TS. The second printed circuit board TFPC may be implemented with a rigid PCB or flexible PCB. The second printed circuit board TFPC may include various types of conductive patterns (lines), circuit elements, or the like.

The second printed circuit board TFPC and the lines included therein may extend along a portion of the back of the display panel DP, and be electrically connected to the main circuit board MB including the AP, etc., through a designated connector (e.g., a second connector CNT2). At least a portion of the second printed circuit board TFPC may overlap with the first printed circuit board DFPC.

In an embodiment, the second printed circuit board TFPC may have a multi-layered structure including at least one conductive layer and at least one insulating layer. In an embodiment, the second printed circuit board TFPC may include a ground layer (or ground pattern) having the second ground portion GP2. The ground layer may be connected as a ground to a line and a circuit, which are included in the second printed circuit board TFPC. In such an embodiment, the ground pattern may be located in a plurality layers in the second printed circuit board TFPC through a contact hole, etc.

The second ground portion GP2 may be exposed to an outside of the second printed circuit board TFPC, and be connected to the ground pattern (e.g., the first ground portion GP1) of the first printed circuit board DFPC by a second conductive material CM2. The second conductive material CM2 may include a same material as the first conductive material CM1.

Accordingly, the second plate MP2, a ground of the first printed circuit board DFPC, and a ground of the second printed circuit board TFPC may be electrically connected to the system ground SGND through a common ground path. Thus, a surge voltage such as static electricity ESD, which is generated in the display device 1, is rapidly discharged through the group path, and the introduction of static electricity ESD into the first and second driving integrated circuits DIC and TIC can be minimized.

In an embodiment, as shown in FIG. 2B, the contact portion CP1, the first ground portion GP1 and the second ground portion GP2 may be disposed in a predetermined contact area CA. In one embodiment, for example, the contact portion CP1, the first ground portion GP1 and the second ground portion GP2 may be located to overlap with each other. However, this is merely exemplary, and at least one of the contact portion CP1, the first ground portion GP1 and the second ground portion GP2 may not overlap with each other.

In an embodiment, each of a ground terminal of the first driving integrated circuit DIC and a ground terminal of the second driving integrated circuit TIC may be electrically connected to the system ground SGND via a predetermined electrostatic discharge protection circuit (or a passive element).

Figure 3A:
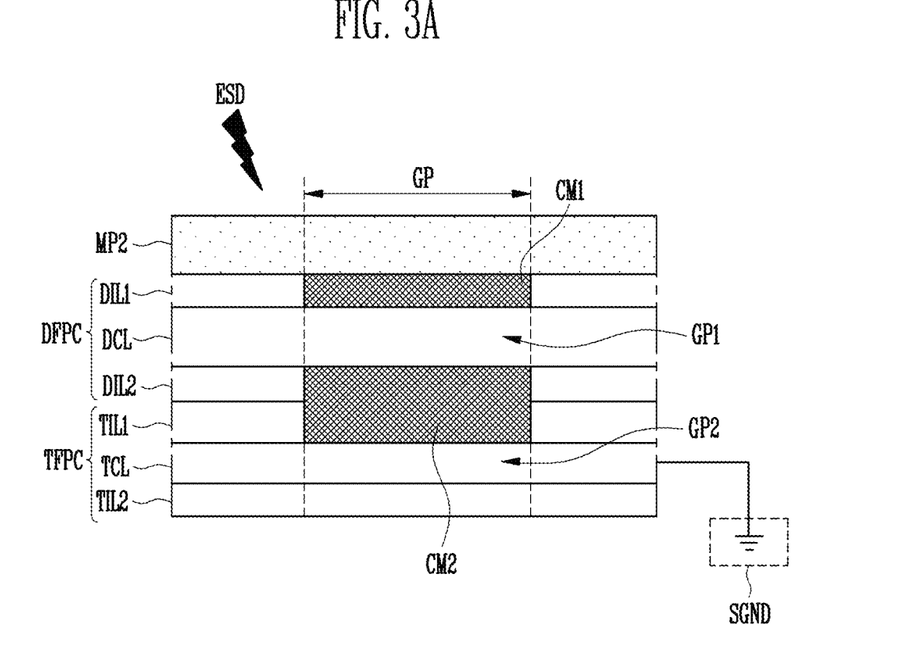
FIG. 3A is a sectional view illustrating an embodiment of a contact area of the display device shown in FIG. 2A.
Figure 3B:
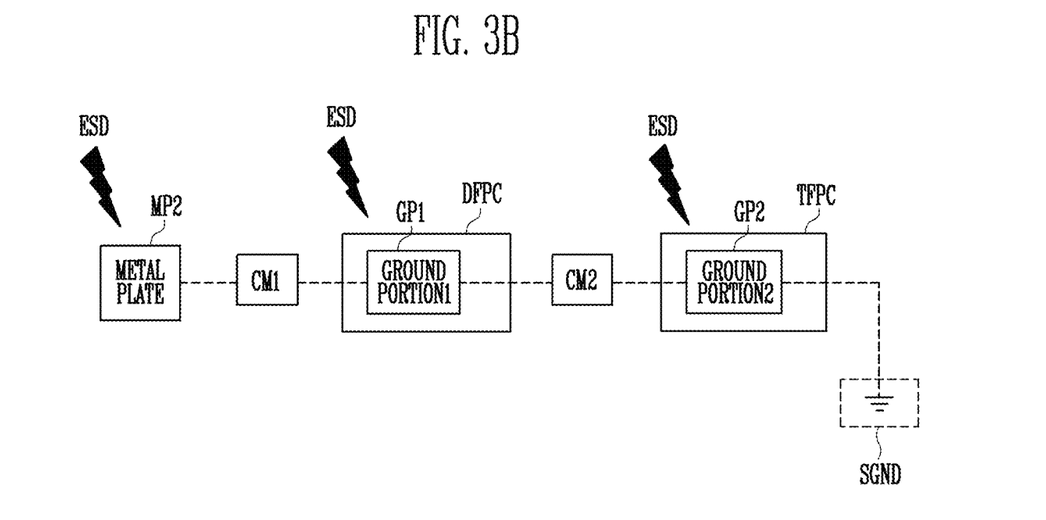
FIG. 3B is a block diagram illustrating an embodiment of an electrostatic discharge of the display device shown in FIG. 2.

FIG. 3A is a sectional view illustrating an embodiment of a contact area of the display device shown in FIG. 2A. FIG. 3B is a block diagram illustrating an electrostatic discharge of the display device shown in FIG. 2A.

In FIGS. 3A and 3B, the same or like elements or components as those described above with reference to FIGS. 2A to 2C are designated by same or like reference numerals, and any repetitive detailed descriptions thereof will be omitted or simplified.

Referring to FIGS. 2A to 3B, the second plate MP2, the ground of the first printed circuit board DFPC, and the ground of the second printed circuit board TFPC may be electrically connected to the system ground SGND through the common ground path.

A portion (e.g., the contact portion CP1 shown in FIG. 2A) of the second plate MP2 may be in contact with the first conductive material CM1.

The first printed circuit board DFPC may be implemented in a multi-layer or may have a multi-layer structure. In one embodiment, for example, the first printed circuit board DFPC may include a first insulating layer DIL1, a second insulating layer DIL2, and a conductive layer DCL disposed between the first insulating layer DIL1 and the second insulating layer DIL2, as shown in FIG. 3A. However, this is merely exemplary, and the stacked structure of the first printed circuit board DFPC is not limited thereto. In one embodiment, for example, the first printed circuit board DFPC may include a plurality of conductive layers and a plurality of insulating layers.

The first and second insulating layers DIL1 and DIL2 may include an organic insulating material, an inorganic insulating material, or a combination thereof, e.g., an organic/inorganic mixed material.

The conductive layer may include a plurality of conductive patterns (or lines). Some of the conductive patterns may be ground patterns (or ground lines), and include the first ground portion GP1.

In an embodiment, the first ground portion GP1 may be exposed from the first insulating layer DIL1 and/or the second insulating layer DIL2 through patterning thereof. In one embodiment, for example, a surface of the first ground portion GP1 may be in contact with the first conductive material CM1, and an opposing surface of the first ground portion GP1 may be in contact with the second conductive material CM2. Accordingly, the second plate MP2 and the ground (i.e., the first ground portion GP1) of the first printed circuit board DFPC may be electrically connected to each other.

The second printed circuit board TFPC may be implemented in a multi-layer or may have a multi-layer structure. In one embodiment, for example, the second printed circuit board TFPC may include a third insulating layer TIL1, a fourth insulating layer TIL2, and a conductive layer TCL disposed between the third insulating layer TIL1 and the fourth insulating layer TIL2, as shown in FIG. 3A. However, this is merely exemplary, and the stacked structure of the second printed circuit board TFPC is not limited thereto. In one embodiment, for example, the second printed circuit board TFPC may include a plurality of conductive layers and a plurality of insulating layers.

The third and fourth insulating layers TIL1 and TIL2 may include an organic insulating material, an inorganic insulating material, or a combination thereof, e.g., an organic/inorganic mixed material.

The conductive layer may include a plurality of conductive patterns (or lines). Some of the conductive patterns may be ground patterns (or ground lines), and include the second ground portion GP2.

In an embodiment, the second ground portion GP2 may be exposed from the third insulating layer TIL1 through patterning thereof. In one embodiment, for example, the exposed surface of the second ground portion GP2 may be in contact with the second conductive material CM2. Accordingly, the ground (i.e., the second ground portion GP2) of the second printed circuit board TFPC and the ground (i.e., the first ground portion GP1) of the first printed circuit board DFPC may be electrically connected to each other.

The ground line (or ground pattern) of the second printed circuit board TFPC may be electrically connected to the system ground SGND.

Therefore, as shown in FIG. 3B, the second plate MP2, the first ground portion GP1 of the first printed circuit board DFPC, and the second ground portion GP2 of the second printed circuit board TFPC may be electrically connected to the system ground SGND, and an electrostatic discharge path may be defined therethrough to the system ground SGND. Accordingly, a surge voltage introduced into the second plate MP2, the first printed circuit board DFPC, and/or the second printed circuit board TFPC may be discharged to the system ground SGND through the electrostatic discharge path.

In an embodiment, as shown in FIG. 3A, the second plate MP2 and the first printed circuit board DFPC are in contact with each other and the first printed circuit board DFPC and the second printed circuit board TFPC are in contact with each other, but not being limited thereto. Alternatively, such components may be disposed to be spaced apart from each other.

In an embodiment, as shown in FIG. 3A, the arrangement positions of the first conductive material CM1 and the second conductive material CM2 overlap with each other, but the disclosure is not limited thereto.

Figure 4A:
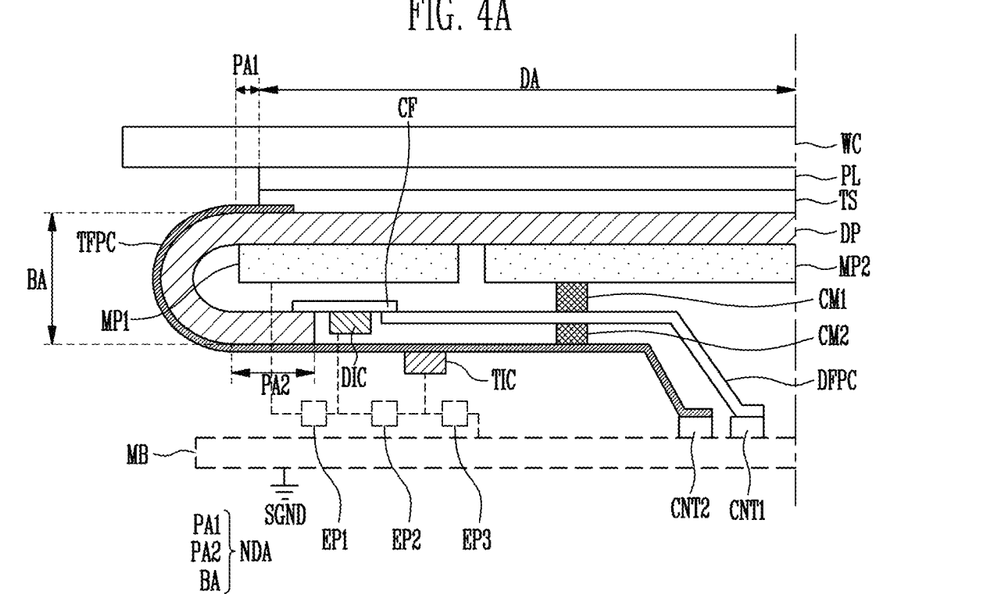
FIG. 4A is a sectional view illustrating a ground connection relationship of an embodiment of driving integrated circuits included in the display device shown in FIG. 2C.
Figure 4B:
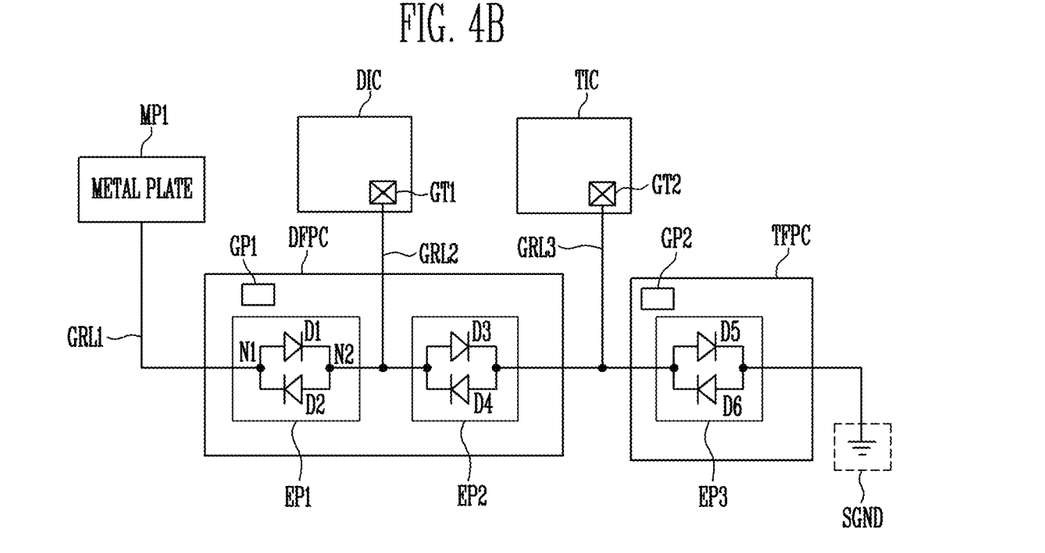
FIG. 4B is a block diagram illustrating the ground connection relationship of an embodiment of the driving integrated circuits of the display device shown in FIG. 4A.

FIG. 4A is a sectional view illustrating a ground connection relationship of an embodiment of the driving integrated circuits included in the display device shown in FIG. 2C. FIG. 4B is a block diagram illustrating the ground connection relationship of an embodiment of the driving integrated circuits of the display device shown in FIG. 4A.

Referring to FIGS. 1, 2C, 4A and 4B, each of the first plate MP1, a first ground terminal GT1 of the first driving integrated circuit DIC, and a second ground terminal GT2 of the second driving integrated circuit TIC may be electrically connected to the system ground SGND through electrostatic discharge protection circuits EP1, EP2, and EP3.

In an embodiment, as shown in FIG. 4A, the first plate MP1, the ground of the first driving integrated circuit DIC, and the ground of the second driving integrated circuit TIC may be indirectly connected to the electrostatic discharge path described above with reference to FIG. 3B. Therefore, static electricity ESD introduced into the second plate MP2, the first printed circuit board DFPC, and/or the second printed circuit board TFPC is not transferred to the first and second driving integrated circuits DIC and TIC.

In such an embodiment, a ground connection for stable circuit driving is desired for each of the first and second driving integrated circuits DIC and TIC. In an embodiment of the display device 1, a multi-ground path for discharging static electricity ESD may be connected to each of the first and second driving integrated circuits DIC and TIC. In an embodiment, the display device 1 may include first to third electrostatic discharge protection circuit EP1 to EP3. In such an embodiment, the first to third electrostatic discharge protection circuit EP1 to EP3 may be connected in series.

The first electrostatic discharge circuit EP1 may form an electrostatic discharge path by being electrically connected between the first plate MP1 and the first ground terminal GT1 of the first driving integrated circuit DIC. The first plate MP1 may be electrically connected to the system ground SGND through the first electrostatic discharge protection circuit EP1.

The first electrostatic discharge protection circuit EP1 may disperse static electricity ESD introduced into the first plate MP1 into the first ground terminal GT1 (and a ground path including the first ground terminal GT1) of the first driving integrated circuit DIC and the second electrostatic discharge protection circuit EP2.

In an embodiment, the first electrostatic discharge protection circuit EP1 may include first and second diodes D1 and D2 connected in parallel between a first node N1 and a second node N2. The first and second diodes D1 and D2 may be connected in a bidirectional diode structure having different directionalities between the first node N1 and the second node N2.

The first diode D1 may include a first terminal electrically connected to the first ground terminal GT1 (i.e., the second node N2) and a second terminal connected to the first plate MP1 (i.e., the first node N1). The second diode D2 may include a first terminal connected to the first plate MP1 (i.e., the first node N1) and a second terminal electrically connected to the first ground terminal GT1 (i.e., the second node N2). The connection structure of the first and second diodes D1 and D2 may be referred to as a back-to-back diode.

In an embodiment, the first electrostatic discharge protection circuit EP1 may be disposed on the first printed circuit board DFPC. The first electrostatic discharge protection circuit EP1 may be disposed to be spaced apart from a ground line including the first ground portion GP1 of the first printed circuit board DFPC. In such an embodiment, the first electrostatic discharge protection circuit EP1 may form an electrostatic discharge path separate from the electrostatic discharge path (ground path) formed between the first ground portion GP1 and the system ground SGND.

In an embodiment, the display device 1 may further include a first ground line GRL1 for electrically connecting the first node of the first electrostatic discharge protection circuit EP1 and the first plate MP1 to each other. In one embodiment, for example, the first ground line GRL1 may be disposed on the first printed circuit board DFPC, and the first ground line GRL1 and the first plate MP1 may be connected to each other through a portion at which the first plate MP1 and the first printed circuit board DFPC are in electrical (and physical) contact with each other.

In an embodiment, the display device 1 may further include a second ground line for electrically connecting the second node N2 of the first electrostatic discharge protection circuit EP1 and the first ground terminal GT1 to each other. The second ground line CRL2 may also be connected to the second electrostatic discharge protection circuit EP2.

The second and third electrostatic discharge protection circuits EP2 and EP3 may substantially have a same configuration as the first electrostatic discharge protection circuit EP1 described above. The second electrostatic discharge protection circuit EP2 may include a back-to-back diode configured with third and fourth diodes D3 and D4, and the third electrostatic discharge protection circuit EP3 may include a back-to-back diode configured with fifth and sixth diodes D5 and D6.

In an embodiment, the second electrostatic discharge protection circuit EP2 may be electrically connected between the first ground terminal GT1 and the second ground terminal GT2. The display device 1 may further include a third ground line CRL3 for electrically connecting the second electrostatic discharge protection circuit EP2 and the second ground terminal GT2 to each other. The third ground line CRL3 may be electrically connected between the second electrostatic discharge protection circuit EP2 and the third electrostatic discharge protection circuit EP3.

In an embodiment, the second electrostatic discharge protection circuit EP2 may be disposed on the first printed circuit board DFPC. The second electrostatic discharge protection circuit EP2 may be disposed to be spaced apart from the ground line including the first ground portion GP1.

In an embodiment, the second electrostatic discharge protection circuit EP2 may be disposed on the second printed circuit board TFPC. The second electrostatic discharge protection circuit EP2 may be disposed to be spaced apart from a ground line including the second ground portion GP2.

In an embodiment, the second electrostatic discharge protection circuit EP2 and the third electrostatic discharge protection circuit EP3 may be electrically connected to each other through a portion at which the first printed circuit board DFPC and the second printed circuit board TFPC are in electrical/physical contact with each other.

The third electrostatic discharge protection circuit EP3 may be electrically connected between the second ground terminal GT2 and the system ground SGND. The third electrostatic discharge protection circuit EP3 may be disposed to be spaced apart from the ground line including the second ground portion GP2.

Therefore, electrostatic discharge paths defined by the first to third electrostatic discharge protection circuit EP1 to EP3 may be operated separately from the electrostatic discharge path described above with reference to FIG. 3B.

In one embodiment, for example, when high-potential static electricity ESD is introduced into the first driving integrated circuit DIC, the static electricity ESD may be dispersed by the turned-on second and third diodes D2 and D3. When high-potential static electricity ESD is introduced into the second driving integrated circuit TIC, the static electricity ESD may be dispersed by the turned-on fourth and fifth diodes D4 and D5.

In an embodiment, as described above, the ground terminals of the first and second driving integrated circuits DIC and TIC may be formed separately from ground paths between the ground portions GP1 and GP2 of the first and second printed circuit boards DFPC and TFPC and the system ground SGND, and be connected to each other by the first to third electrostatic discharge protection circuits EP1 to EP3. Thus, static electricity ESD is dispersed or decreased through the multi-ground path to which the first and second driving integrated circuits DIC and TIC are connected, and the ground paths connected to the driving integrated circuits (i.e., DIC and TIC) from the grounds of the printed circuit boards (i.e., DFPC and TFPC) are blocked. Therefore, the driving integrated circuits DIC and TIC may be effectively protected from a surge voltage such as static electricity ESD.

Figure 5:
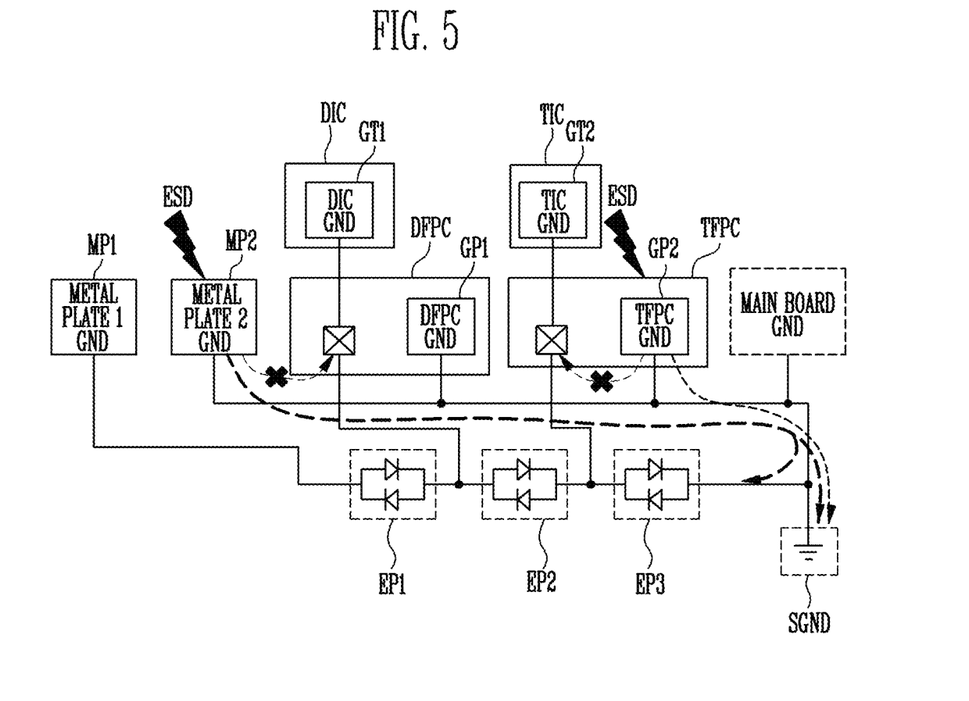
FIG. 5 is a block diagram illustrating an electrostatic discharge operation of an embodiment of the display device shown in FIG. 1.

FIG. 5 is a block diagram illustrating an electrostatic discharge operation of an embodiment of the display device shown in FIG. 1.

Referring to FIGS. 3B, 4B, and 5, in an embodiment, (the ground of) the second plate MP2, the ground (i.e., the first ground portion GP1) of the first printed circuit board DFPC, the ground (i.e., the second ground portion GP2) of the second printed circuit board TFPC, and the ground of the main circuit board may be commonly connected to the system ground SGND, and static electricity ESD may be discharged through a common first ground path.

In such an embodiment, the ground (e.g., the first ground terminal GT1) of the first driving integrated circuit DIC and the ground (e.g., the second ground terminal GT2) of the second driving integrated circuit TIC are separated from the first ground path. Thus, static electricity ESD introduced into the second plate MP2, the first printed circuit board DFPC, and/or the second printed circuit board TFPC is discharged through the first ground path, and the introduction of static electricity ESD into the first driving integrated circuit DIC and the second driving integrated circuit TIC may be effectively prevented.

In such an embodiment, the first to third electrostatic discharge protection circuits EP1 to EP3 connected in series may be disposed on conductive paths branching off from the first ground path to be electrically connected between the first and second ground terminals GT1 and GT2. Thus, when static electricity ESD having a very high potential (about 10 kV or more) is introduced into the second plate MP2, the first printed circuit board DFPC and/or the second printed circuit board TFPC, the static electricity ESD may be dispersed or discharged through the first to third electrostatic discharge protection circuits EP1 to EP3. In such an embodiment, when a surge voltage such as static electricity ESD is generated in the first driving integrated circuit DIC and/or the second driving integrated circuit TIC, the ground path is dispersed into several parts by operations of the first to third electrostatic discharge protection circuits EP1 to EP3, such that the first driving integrated circuit DIC and the second driving integrated circuit TIC can be protected from static electricity ESD.

In an embodiment, as described above, the display device 1 includes the first plate MP1 and the second plate MP2, which are disposed separately from each other, so that influence of a surge voltage such as static electricity ESD, which is transferred through the second plate MP2, on the first and second driving integrated circuits DIC and TIC may be substantially reduced.

In an embodiment of the display device 1, the first ground path along which the grounds of the second plate MP2, the first printed circuit board DFPC, and the second printed circuit board TFPC are commonly connected to the system ground SGND is formed, and the grounds of the first and second driving integrated circuits DIC and TIC are separated from the first ground path. In such an embodiment, the grounds of the first and second driving integrated circuits DIC and TIC are connected to each other by the back-to-back diodes, so that a surge voltage such as static electricity may be dispersed and/or reduced. Thus, the inflow of a surge voltage into the first and second driving integrated circuits DIC and TIC may be minimized or effectively prevented, and the display device may be stably driven.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a display panel including a display area including pixels and a non-display area adjacent to the display area;
   a first driving integrated circuit including a first ground terminal, wherein the first driving integrated circuit is electrically connected to the display panel;
   a first printed circuit board electrically connected to the first driving integrated circuit;
   a first plate disposed on a bottom surface of the display panel and overlapping with the first driving integrated circuit; and
   a second plate disposed on the bottom surface of the display panel and spaced apart from the first plate, wherein the second plate is electrically connected to a system ground,
   wherein an area of a portion of the display panel overlapping with the first plate is smaller than an area of another portion of the display panel overlapping with the second plate, and
   wherein each of the first plate and the second plate is a metal plate.

2. The display device of claim 1, further comprising:
   a conductive film on which the first driving integrated circuit is mounted,
   wherein the conductive film is electrically connected between the display panel and the first printed circuit board.

3. The display device of claim 1, wherein
   the first printed circuit board includes a first ground portion electrically connected to the system ground, and
   a first conductive material is disposed between the second plate and the first ground portion to electrically connect the second plate and the first ground portion to each other.

4. The display device of claim 3, wherein the first conductive material is a conductive tape or a conductive pressure sensitive adhesive.

5. The display device of claim 3, further comprising:
   a first electrostatic discharge protection circuit electrically connected between the first plate and the first ground terminal, wherein the first electrostatic discharge protection circuit forms an electrostatic discharge path,
   wherein the first plate is electrically connected to the system ground through the first electrostatic discharge protection circuit.

6. The display device of claim 5, wherein the first electrostatic discharge protection circuit is disposed on the first printed circuit board.

7. The display device of claim 5, wherein the first electrostatic discharge protection circuit is disposed to be spaced apart from the first ground portion of the first printed circuit board.

8. The display device of claim 7, further comprising:
   a first ground line which connects the first plate and the first electrostatic discharge protection circuit to each other; and
   a second ground line which connects the first ground terminal and the first electrostatic discharge protection circuit to each other.

9. The display device of claim 5, wherein the first electrostatic discharge protection circuit comprises:
   a first diode including a first terminal electrically connected to the first ground terminal and a second terminal electrically connected to the first plate; and
   a second diode including a first terminal electrically connected to the first plate and a second terminal electrically connected to the first ground terminal.

10. The display device of claim 5, further comprising:
    an input sensor disposed on a top surface of the display panel and overlapping with the display area;
    a second driving integrated circuit electrically connected to the input sensor, wherein the second driving integrated circuit includes a second ground terminal; and
    a second printed circuit board electrically connected to the second driving integrated circuit.

11. The display device of claim 10, wherein
    the second printed circuit board includes a second ground portion electrically connected to the system ground,
    a second conductive material is disposed between the first printed circuit board and the second ground portion to electrically connect the first ground portion and the second ground portion to each other.

12. The display device of claim 11, further comprising:
    a second electrostatic discharge protection circuit electrically connected between the first ground terminal and the second ground terminal.

13. The display device of claim 12, wherein the second electrostatic discharge protection circuit is disposed on the first printed circuit board or the second printed circuit board.

14. The display device of claim 12, further comprising:
    a third electrostatic discharge protection circuit electrically connected between the second ground terminal and the system ground.

15. The display device of claim 14, wherein the third electrostatic discharge protection circuit is disposed on the first printed circuit board or the second printed circuit board.

16. The display device of claim 1, wherein
    the non-display area of the display panel includes: a first peripheral area adjacent to the display area, a second peripheral area spaced apart from the first peripheral area, and a bent area between the first peripheral area and the second peripheral area, and
    at least a portion of the first plate overlaps with the first driving integrated circuit and the second peripheral area.

17. A display device comprising:
    a display panel including a display area including pixels and a non-display area adjacent to the display area;
    a first driving integrated circuit including a first ground terminal, wherein the first driving integrated circuit is electrically connected to the display panel;
    a first printed circuit board including a first ground portion spaced apart from the first ground terminal, wherein the first printed circuit board is electrically connected to the first driving integrated circuit;
    an input sensor disposed on a top surface of the display panel and overlapping with the display area;
    a second driving integrated circuit electrically connected to the input sensor, wherein the second driving integrated circuit includes a second ground terminal;
    a second printed circuit board including a second ground portion spaced apart from the second ground terminal, wherein the second printed circuit board is electrically connected to the second driving integrated circuit;
    a first plate disposed on a bottom surface of the display panel and overlapping with the first driving integrated circuit and the second driving integrated circuit; and
    a second plate disposed on the bottom surface of the display panel and spaced apart from the first plate, wherein the second plate, the first ground portion, and the second ground portion are electrically connected to a system ground.

18. The display device of claim 17, further comprising:

a first electrostatic discharge protection circuit electrically connected between the first plate and the first ground terminal;

a second electrostatic discharge protection circuit electrically connected between the first ground terminal and the second ground terminal; and a third electrostatic discharge protection circuit electrically connected between the second ground terminal and the system ground.

\* \* \* \* \*